United States Patent [19]

Kuo et al.

[11] Patent Number: 5,049,524
[45] Date of Patent: Sep. 17, 1991

[54] CD DIFFUSION IN INP SUBSTRATES

[75] Inventors: Jui-Yuan Kuo, Taipei; Chia-Pin Sung, Hsinchu, both of Taiwan

[73] Assignee: Industrial Technology Research Institute, Taiwan

[21] Appl. No.: 317,849

[22] Filed: Mar. 2, 1989

[51] Int. Cl.$^5$ .......................................... H01L 21/223
[52] U.S. Cl. .................................... 437/169; 437/168; 437/166
[58] Field of Search ............... 437/165, 168, 169, 167, 437/166

[56] References Cited

U.S. PATENT DOCUMENTS

| | | | |
|---|---|---|---|
| 3,003,900 | 10/1961 | Levi | 437/169 |
| 3,070,467 | 12/1962 | Fuller et al. | 437/169 |
| 3,314,832 | 4/1967 | Raithel | 437/169 |
| 3,377,216 | 4/1968 | Raithel | 437/169 |
| 3,649,387 | 3/1972 | Frentz et al. | 437/169 |
| 3,660,178 | 5/1972 | Takahashi et al. | 437/167 |
| 3,755,017 | 8/1973 | Coughlin | 437/169 |
| 3,984,267 | 10/1976 | Craford et al. | 437/169 |
| 4,415,385 | 11/1983 | Saito | 437/169 |
| 4,592,793 | 6/1986 | Hovel et al. | 437/168 |

FOREIGN PATENT DOCUMENTS

| | | | |
|---|---|---|---|
| 0044791 | 3/1980 | Japan | 437/168 |
| 0027920 | 3/1981 | Japan | 437/169 |
| 0044563 | 10/1981 | Japan | |
| 0152235 | 11/1981 | Japan | |
| 0224217 | 11/1985 | Japan | 437/168 |
| 0150340 | 7/1986 | Japan | 437/169 |

OTHER PUBLICATIONS

Benjamin, "Plug-Type Vacuum Diffusion System", IBM Technical Disclosure Bulletin, vol. 15, No. 2, Jul. 1972, pp. 414–415.
Martina et al., "Process to Prevent Dislocation Generation and Wafer Warpage During High Temperature Semiconductor Device Wafer Processing", IBM Technical Disclosure Bulletin, vol. 15, No. 7, Dec. 1972, pp. 2142–2143.
Favennec et al., "Open Ampule Diffusion in InP", Electronics Letters, vol. 16, No. 22, 23rd Oct. 1980, pp. 832–833.
Handbook of Chemistry and Physics, 67th Edition 1986-1987, p. B-28.
J. Y. Kuo and C. P. Sung, Cd Diffusion in InP, *MRL Bulletin of Research and Development*, vol. 2, No. 2, pp. 47-51, Sep. 1988.

*Primary Examiner*—Olik Chaudhuri
*Assistant Examiner*—M. Wilczewski
*Attorney, Agent, or Firm*—Scully, Scott, Murphy & Presser

[57] ABSTRACT

A process for diffusing Cd into an InP substrate comprising:
a. pre-heating a sealed tube containing red P and $Cd_3P_2$ at the opening of a diffusion furnace;
b. effecting the diffusion within the diffusion furnace; and
c. furnace cooling the sealed tube at the opening of the diffusing furnace.

3 Claims, 2 Drawing Sheets

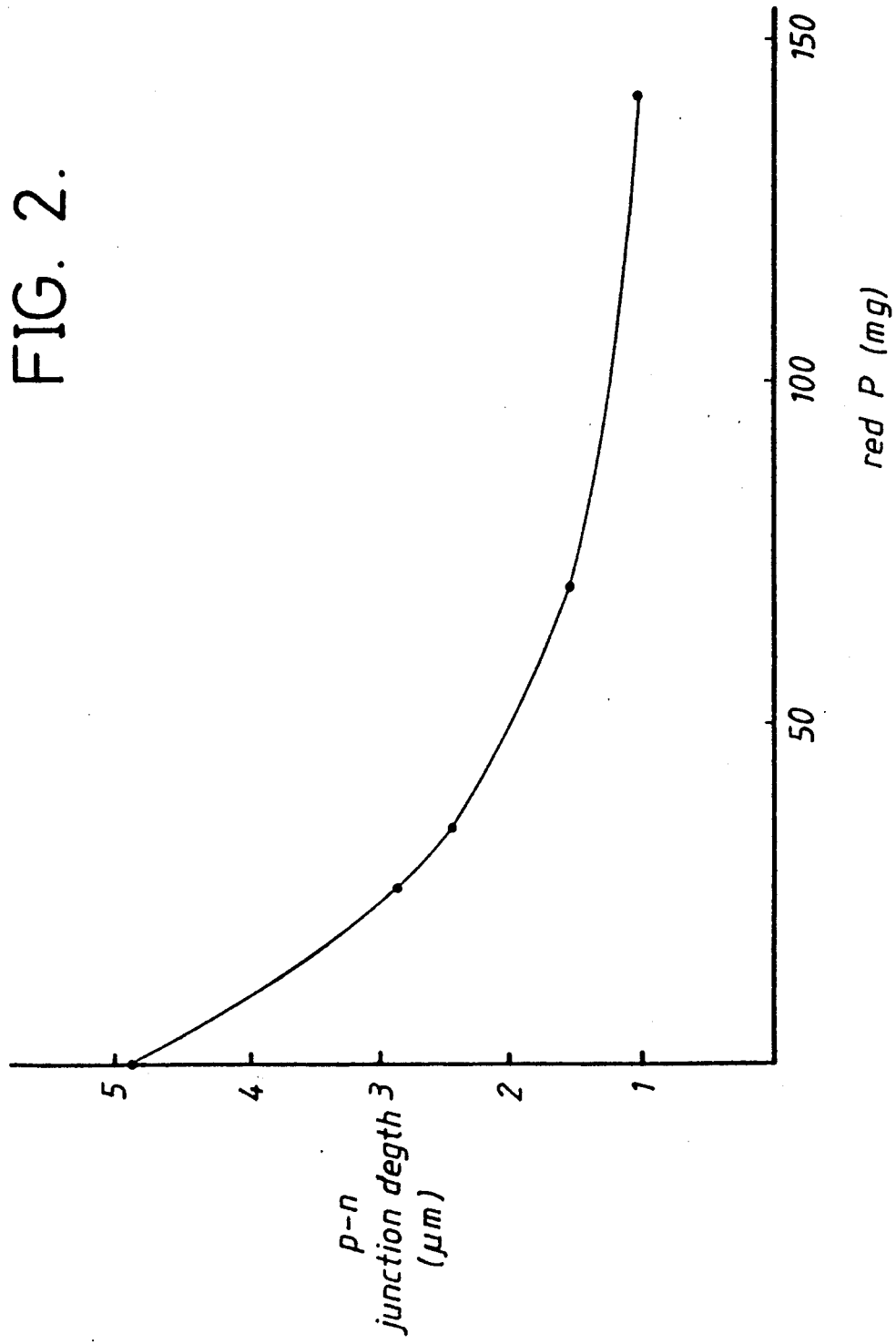

CD DIFFUSION IN INP SUBSTRATES

BACKGROUND OF THE INVENTION

The present invention is related to a process for diffusing Cd dopant into an InP substrate within an evacuated and sealed tube. The volume of the diffusion chamber of the sealed tube used in the present invention can be much larger than 10 cc. and may be 150 cc. or more. The invention thus can attain the simultaneous diffusion of a large number of InP substrate wafers, rendering it possible to use the sealed tube diffusion technique in the mass production of Cd-diffused InP substrate wafers.

Optical fiber communication will become one of the primary mediums for long-distance and mass-information communication. For producing the laser diodes, light emitting diodes and photo-detectors utilized in the $SiO_2$-based optical fiber system, the InP/InGaAsP material system is often adopted because the $SiO_2$-based optical fibers have the lowest optical loss at the wavelengths of 1.3 and 1.55 micrometers, while the material system has an energy gap range from 1.0 to 1.6 micrometers which cover the two lowest loss values. The optoelectronic devices produced with the material system have thus been widely used in the illuminating sources and photo-receivers of the optical fiber communication system.

In the production of the optoelectronic devices, the vapor phase diffusion method is used to diffuse the atoms of Group II elements, such as Zn and Cd, into InP wafers to form p-n junctions or local areas of high hole carrier concentration to facilitate the formation of ohmic contacts. The method is a critical and important technique because the Zn- or Cd-diffusion can form high quality p-n junction or high hole concentration areas which in turn have a critical influence on the properties of the optoelectronic elements. Compared with Cd dopant, Zn dopant's diffusion speed is higher, its diffusion control is more difficult and the resultant p-n junction depth is less uniform. These defects of Zn-diffusion become more serious when a shallow p-n junction depth (e.g. less than a few micrometers) is desired and when the volume of the diffusion chamber of the sealed tube is increased. In contrast, Cd-diffusion has the advantages of easy diffusion control, uniform p-n junction depth and good reproducibility. Therefore, it is advantageous to use Cd as the dopant when a tube having a large-volume chamber is used. In the mass production of optoelectronic devices, it is desired that the mirror-like surface of the wafer can be maintained after diffusion, the physical and electrical properties of the diffusion layer have good controlability and reproducibility, and a large number or a large area of wafers can be diffused simultaneously for economic benefits. Therefore, the provision of a Cd-diffusion technique which is capable of mass producing diffused wafers in a scaled-up diffusion chamber and has good controlability and reproducibility on diffusion results is highly desirable for the production of InP-system optoelectronic devices.

DESCRIPTION OF PRIOR ART

For Cd- or Zn-diffusion of InP substrates, a small-volume sealed tube diffusion technique was conventionally used, whereby a diffusion source material (e.g. $Cd_3P_2$) and wafers put in a quartz tube were subjected to a vapor diffusion operation in a diffusion furnace after evacuating and sealing the tube. Though the diffusion results obtained under a small tube volume (less than 20 cc.) were good, those obtained under a large tube volume (e.g. more than 100 cc.) were not satisfactory because thermal damages and the precipitates of the diffusion source material often appeared on the wafer surface and the controlability and reproducibility of diffusion were poor. The thermal damages on the wafer surface are a phenomenum of thermo-decomposition caused by the evaporation of phosphorous molecules from the surface of InP substrate wafers at a temperature of 300° C. or more. The higher the temperature, the more the evaporated phosphorous molecules and the more the surface damages. To inhibit the evaporation of phosphorous molecules and the thermo-decomposition of wafer surface, an adequate phosphorous pressure supplied by the diffusion source material should be maintained near the wafers during diffusion. Although the phosphorous pressure resulting from the evaporation of common diffusion source materials (e.g. $Cd_3P_2$) can provide the necessary phosphorous pressure when the temperature in the diffusion chamber has reached a stable value, it cannot provide the necessary phosphorous pressure before the temperature in the diffusion chamber of the tube reaches a stable value. In other words, the phosphorous pressure resulting from the evaporation of the common diffusion materials is not under its saturation value during the period from when the diffusion chamber is put into the diffusion furnace to the temperature of diffusion chamber reaches the stable value. Therefore, during this period the phosphorous molecules tend to evaporate from the wafer surface which results in surface damages. The defect is not serious when the volume of the diffusion chamber is small because the unstable period is short, but becomes serious when the diffusion chamber is scaled-up because a longer time is required to reach the stable status. Moreover, in the case of a scaled-up diffusion chamber, there may be a temperature difference between the front end and the rear end of the diffusion chamber when the diffusion operation is just started. It takes a period of time for the temperature difference to disappear. During this period, the vapor in the diffusion chamber may have a convection flow due to the temperature difference, incurring the possibility of evaporation of phosphorous molecules from the wafer surface.

Moreover, when the diffusion tube is removed out of the high-temperature diffusion furnace after diffusion, the vapors in the chamber will quickly be cooled toward room temperature and form precipitates on the wafer surface, which damage the mirror-like state of the wafer surface and are hard to be removed. The defect becomes more serious when the diffusion chamber is scaled-up because more vapor molecules exist in the chamber. Due to the above defects of surface damages and precipitates, the sealed tube diffusion technique could only be carried out with small-volume quartz tubes.

To reduce the defects, a semi-sealed diffusion technique was adopted, whereby the vapor phase diffusion was effected in a semi-sealed diffusion chamber which was purged with $H_2$ or $N_2$ gas. The semi-sealed diffusion technique permits the scale up of the diffusion chamber and the increase of surface area of wafers, and can avoid thermal damages. However, it has two disadvantages. One is the use of $H_2$ or $N_2$ gas which causes an increase in material and operation costs. The other is that the diffusion reproducibility is poor. The defect in reproducibility is caused by the fact that the diffusion chamber is not under vaccum sealed status when the diffusion is started and thus gases and vapors can enter or exit the diffusion chamber, rendering it difficult to maintain the composition and pressure of the gases and vapors within the chamber at a stable status. The difficulty in controlling the reproducibility is a severe defect when the desired diffusion depth or the resultant p-n junction depth is only a few micrometers or when high-precision optoelectronic devices are to be manufactured.

As a summary, the traditional sealed tube diffusion technique and semi-sealed diffusion technique have their respective disadvantages. There still is a need for a technique which can use a large-volume tube with simple apparatus, attain thermal-damage free and precipitate free wafer surfaces, and obtain good results in controlability and reproducibility for mass production.

DETAILED DESCRIPTION OF THE INVENTION

The present invention is a process for the diffusion of Cd into InP substrates, which enables the use of a scaled-up sealed tube. The process uses simple apparatus and can diffuse a large number of wafers or a large surface area of wafers in a run and thus meets the requirements for mass production and economic benefits.

In the first aspect of the invention, there is provided a process for diffusing Cd into InP substrates which is characterized by pre-heating the sealed tube before diffusion.

In the second aspect of the invention, there is provided a process for diffusing Cd into InP substrates which is characterized by furnace cooling the sealed tube after diffusion.

In the third aspect of the invention, there is provided a process for diftusing Cd into InP substrates which is characterized by a combination of the characteristics of the above two aspects of the invention. An embodiment of the invention is a process for diffusing Cd into an InP substrate comprising:

a. pre-heating a sealed tube containing red P and $Cd_3P_2$ at the opening of the diffusion furnace;
b. effecting the diffusion within the diffusion furnace; and
c. furnace cooling the sealed tube at the opening of the diffusion furnace.

More specifically, an embodiment of the invention is a process for diffusing Cd into InP substrate comprising:

a. heating a diffusion furnace to obtain a constant diffusion temperature zone at its middle part, and putting near the opening of the furnace an evacuated and sealed tube which contains $Cd_3P_2$ and red P near the front tube end and InP substrate wafers at the tube middle part, with the front end of the tube being positioned inside the furnace and the rear end of the tube being at the opening of the furnace, until deposits which are precipitated from the vapors of the diffusion source material form on the inner wall of the rear end of the tube;
b. pushing the tube into the constant temperature zone of the furnace and keeping the tube there until the completion of diffusion; and
c. pulling the tube back such that the rear end of the tube is at the opening of the furnace, terminating the supply of heat to the furnace, and furnace cooling the tube.

The above processes can also be applied to the diffusion of Cd into GaInP, AlInP, InGaAsP and AlGaInP epitaxy crystals or bulk crystals which contain In and P as the comprising components.

The diffusion temperature for the present invention is normally in the range of 500° to 800° C., a conventional range for diffusion. The invention, however, contemplates higher or lower temperatures.

The invention uses $Cd_3P_2$ and red P as the diffusion source material. Though $Cd_3P_2$ is a known source material, the use of red P together with $Cd_3P_2$ is a special feature of the present invention. The purpose of using red P is to quickly increase the vapor pressure of phosphorous in the tube chamber to the saturated phosphorous pressure under the diffusion temperature, thereby facilitating the inhibition of evaporation of phosphorous molecules from wafer surface to, during the initial stage of diffusion, prevent thermal damages from happening and ensure good controlability and reproducibility of diffusion.

The amount of red P used in the tube is important to the prevention of thermal damages and the attainment of good controlability and reproducibility. If only $Cd_3P_2$ is used as the diffusion source material or if the amount of red P added is less than 0.001 mg per cc. of the volume of the tube, the vapor phosphorous pressure in the tube will not be sufficient to inhibit the evaporation of phosphorous molecules from the wafer surface. On the other hand, if the amount of red P is too high, the resultant vapor phosphorous pressure may be higher than the pressure tolerable by the tube and may cause bursting of the tube. Under the normal diffusion temperature of 500° C. to 800° C., the proper red P amount may be up to 1.5 mg per cc. of the volume of the tube.

According to the process of the present invention the sealed tube should be pre-heated before diffusion.

After the diffusion furnace is heated to form a constant high temperature zone at its middle part for diffusion, the sealed tube is put near the opening of the furnace, with the front end of the tube (where the diffusion source material is put) being positioned in the furnace and the rear end being at the furnace's opening. The pre-heating can heat the diffusion source material to produce vapors of Cd, $P_2$ and $P_4$. The pre-heating is continued until the vapors in the tube form precipitates on the inner wall of the rear end of the tube. The precipitates form because the temperature of the tube's rear end is near room temperature, which is lower than that at the front end. It is believed that the precipitates are $Cd_3P_2$ and white P. The precipitates are very fine particulates and can be more readily evaporated than the diffusion source material. Therefore, they will be very quickly evaporated when the diffusion is effected so that a sufficient amount of phosphorous vapor exists near the InP substrate wafers and the vapor convection caused by the temperature difference between the front end and the rear end is reduced. The surface damages can thus be avoided.

After pre-heating, the sealed tube is pushed to the constant high temperature zone of the diffusion furnace and kept there until the diffusion is completed.

After diffusion, a furnace cooling operation is effected wherein the sealed tube is pulled back to near the opening of the furnace, with the front tube end being positioned in the furnace and the rear end at the furnace's opening. The electric heating source of the furnace is then turned off to cool the tube. The cooling is continued until the tube's temperature is decreased to about 80° C. After cooling, the tube is removed from the furnace and the whole diffusion operation is completed. The purpose of cooling the tube near the opening of furnace is to let the vapors precipitate out only on the inner wall of the tube's rear end, thereby preventing the precipitates from being formed on the wafer surface, and ensuring the production of diffused wafers which have a mirror-like surface as flat and shiny as that of the original wafers. After the electric heating source for the furnace is turned off, the temperature near the furnace's opening decreases about 200° to 250° C. within 10 minutes, depending on the original diffusion temperature. The higher the diffusion temperature, the higher the temperature decrease rate.

The scale-up of the diffusion chamber of the present invention is only limited by the size of the diffusion furnace. The larger the inner diameter of the furnace or the longer the constant temperature zone of the furnace, the larger may be the volume of the chamber.

The invention only needs simple apparatus of a diffusion furnace and sealed tube and does not need $H_2$ or $N_2$ gas which is required by the semi-sealed diffusion technique.

DESCRIPTION OF THE ACCOMPANYING DRAWINGS

FIG. 2 is a chart showing the relation between the p-n junction depth and the amount of red P added according to the invention. The data of the chart were obtained under the following conditions: $Cd_3P_2$:51.5 mg, diffusion temperature: 600° C., diffusion time: 100 min., Sn-doped InP wafers, electron concentration: $5 \times 10^{17}$ cm$^{-3}$, diffusion chamber volume: 150 cc.

Figure 1:
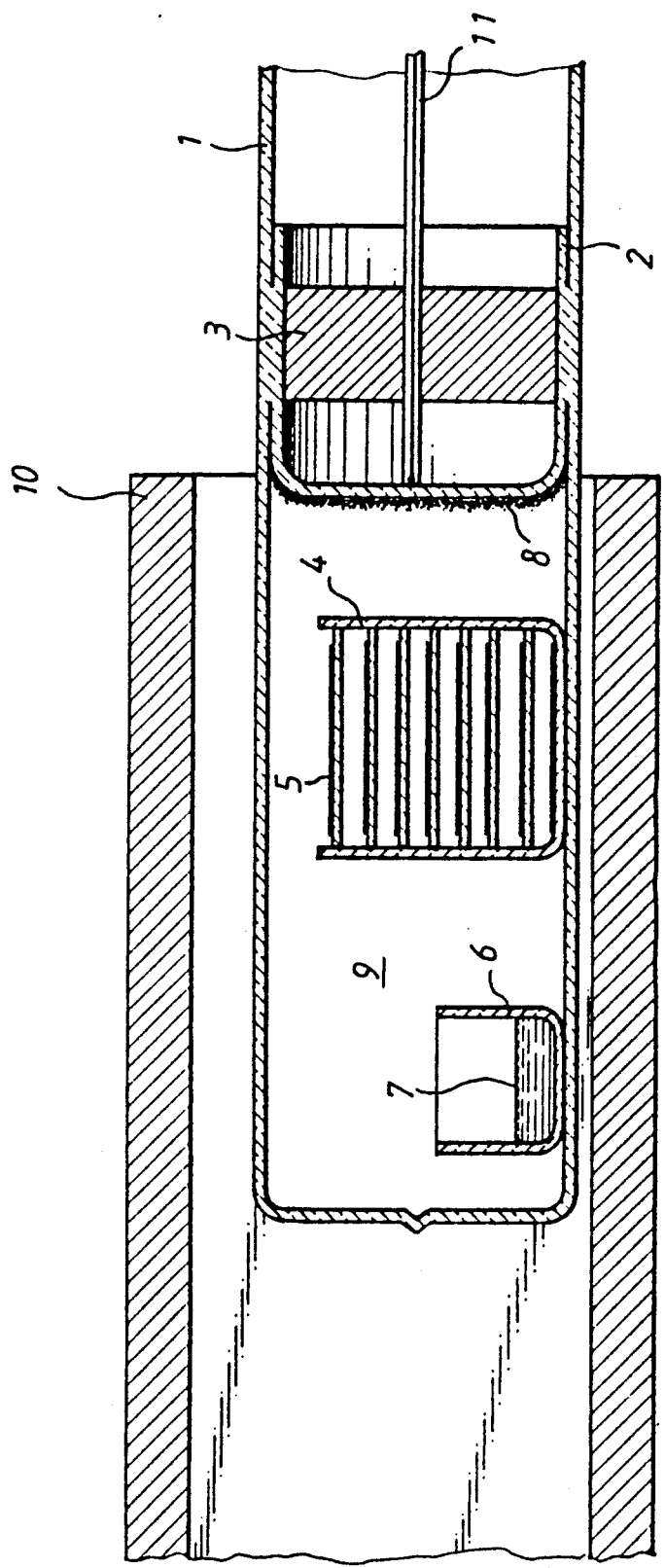
FIG. 1 is a shematic drawing showing in cross-section the arrangement and condition of the diffusion devices after the sealed tube is preheated near the opening of the diffusion furnace.

The invention will be further illustrated by the following example with reference to the accompanying drawings which shall not be interpreted as a limitation of the invention.

EXAMPLES

A quartz tube (1) was loaded at one end with a quartz boat (6) which carried the $Cd_3P_2$ and red P diffusion source material (7). The amount of $Cd_3P_2$ was 51.5 mg and that of red P was 25 mg. A quartz carrier (4) loaded with 8 pieces of $25 \times 20$ mm$^2$ n-type InP wafers (5) was put at the middle part of the tube. A quartz cap (2) was put into the tube to form the diffusion chamber (9). The volume of the chamber can be adjusted by changing the position of the cap. In the present example, the volume was 150 cc. The tube system was then evacuated to have a pressure lower than $10^{-5}$ mbar, sealed by heating with oxyhydrogen flame at the cap's middle portion (3), and put near the opening of a diffusion furnace which had been heated to obtain a zone of constant diffusion temperature (600±5° C.), as shown in FIG. 1, with the tube's front end in the furnace and the rear end (cap end) at the furnace opening. The preheating of the tube was continued for about 20 minutes, until the precipitates of white P and black $Cd_3P_2$ were formed on the wall of quartz cap at the tube's rear end. The tube was then pushed into the constant temperature zone of the furnace for diffusion. After diffusion for about 100 minutes, the tube was pulled back to have the rear end near the furnace opening. The electric heating source of the furnace was turned off for furnace cooling the tube. The cooling of the tube was continued until the tube's temperature was decreased to about 80° C. and then the tube was removed from the furnace. The temperature of the tube was measured by a thermocouple (11) put near the rear end.

The wafers obtained had a surface as flat and shiny as that of the original wafers. There were no surface damages, nor precipitates.

The physical and electrical properties of the diffused wafers have very good uniformity and reproducibility. Table 1 shows the average values and standard deviations of p-n junction depth and hole carrier concentration of the wafers obtained after different runs of diffusion which were conducted for 50 pieces of Sn-doped n-type InP wafers having an electronic concentration of $5 \times 10^{17}$ cm$^{-3}$ at a diffusion temperature of 600° C. for 100 minutes under the conditions set forth in the preceding Example. The very small deviations as shown in Table 1 reveal the excellent controlability and reproducibility of the diffusion result.

TABLE 1

| Physical/Electrical Properties | Average Value | Standard Deviation | |
|---|---|---|---|
| | | Several Runs | One Run |
| p-n Junction Depth (um) | 2.8 | ±0.1 | ±0.05 |
| Hole Concentration ($\times 10^8$ cm$^{-3}$) | 1.2 | ±0.1 | ±0.1 |

We claim:

1. A process for diffusing Cd into a substrate from a diffusion source material comprising red P and $Cd_3P_2$ in a large-volume evacuated and sealed tube wherein the substrate is InP, GaInP, AlInP, InGaAsP or AlGaInP epitaxy crystal wafers or bulk crystal wafers comprising:
   a. heating a diffusion furnace to form a constant diffusion temperature zone at its middle part, and then putting near the opening of the furnace an evacuated and sealed tube which contains said diffusion source material near its front end and said substrate wafers at its middle part with the front end of the tube being positioned inside the furnace and the rear end of the tube being at the opening of the furnace, until deposits which are precipitated from the vapors of the diffusion source material form on the inner wall of the rear end of the tube;
   b. pushing the tube into the constant temperature zone of the furnace and keeping the tube there until the completion of diffusion; and
   c. pulling the tube back such that the rear end of the tube is at the opening of the furnace, terminating the supply of heat to the furnace, and furnace cooling the tube.

2. A process according to claim 1 wherein the substrate is InP.

3. A process according to claim 2 wherein the ratio of the amount of red P before diffusion to the volume of the tube is at least 0.001 mg/cc.

* * * * *